(12) United States Patent
Fischer

(10) Patent No.: US 7,026,174 B2
(45) Date of Patent: Apr. 11, 2006

(54) METHOD FOR REDUCING WAFER ARCING

(75) Inventor: Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 502 days.

(21) Appl. No.: 10/261,403

(22) Filed: Sep. 30, 2002

(65) Prior Publication Data

US 2004/0063316 A1 Apr. 1, 2004

(51) Int. Cl.
*H01L 21/66* (2006.01)
*H01L 21/3065* (2006.01)
*H02N 13/00* (2006.01)

(52) U.S. Cl. .................. 438/14; 438/706; 438/707; 438/710; 438/712; 361/234

(58) Field of Classification Search .............. 438/14, 438/706, 707, 710, 712; 361/234
See application file for complete search history.

(56) References Cited

U.S. PATENT DOCUMENTS

| 5,272,417 A | * | 12/1993 | Ohmi | 315/111.21 |
|---|---|---|---|---|
| 5,737,175 A | | 4/1998 | Grosshart et al. | 361/234 |
| 5,793,192 A | | 8/1998 | Kubly et al. | 323/312 |
| 5,835,335 A | | 11/1998 | Ross et al. | 361/234 |
| 5,894,400 A | | 4/1999 | Graven et al. | 361/234 |
| 6,242,360 B1 | | 6/2001 | Fischer et al. | 438/710 |
| 6,256,186 B1 | | 7/2001 | Powell et al. | 361/234 |
| 6,346,428 B1 | | 2/2002 | Athavale et al. | 438/14 |
| 6,361,645 B1 | | 3/2002 | Schoepp et al. | 361/234 |
| 2002/0017694 A1 | | 2/2002 | Yamaguchi | 257/414 |

OTHER PUBLICATIONS

Andreas Fischer et al., "Wafer Arcing Phenomena and Resolution Trough a Capacitively Coupled Low-Gap Plasma Reactor", 2002 7$^{th}$ International Symposium on Plasma—and Process-Induced Damage.
International Search Report—PCT/US 03/30605 filed Sep. 24, 2003.

* cited by examiner

*Primary Examiner*—Nadine G. Norton
*Assistant Examiner*—Lynette T. Umez-Eronini
(74) *Attorney, Agent, or Firm*—Martine Penilla and Gencarella, LLP

(57) ABSTRACT

A method for reducing wafer damage during an etching process is provided. In one of the many embodiments, the method includes assigning a bias voltage to each of at least one etching process, and generating the assigned bias voltage before initiation of one of the at least one etching process. The method further includes applying the assigned bias voltage to an electrostatic chuck before initiation of one of the at least one etching processes. The assigned bias voltage level reduces wafer arcing.

22 Claims, 10 Drawing Sheets

METHOD FOR REDUCING WAFER ARCING

BACKGROUND OF THE INVENTION

1. Field of the Invention

The present invention relates to wafer processing methods and, more particularly, to efficient and cost effective etch operations for wafers.

2. Description of the Related Art

Modern microchip designs have been trending toward ever more complicated chip structures and toward increased numbers of processing steps for a single chip. In particular, the number of interconnected metal layers stacked on top of each other has grown continuously over the past. With it, the number of plasma processing steps and the amount of thermal and electric stress each wafer incurs during its processing have increased as well. As a result of this enhanced complexity in chip manufacturing plasma induced damage may occur more frequently leading to device destruction and, therefore, to yield losses on a product wafer.

In typical wafer etching operations, the wafer is clamped by an electrostatic chuck (ESC) so that the wafer does not move during wafer etching operation. Under prior art operations, a high voltage is typically applied to the electrodes of the ESC. The electro-static field developed in response of the applied voltage produces an attractive force between the wafer and the ESC. However, as soon as plasma is struck, the wafer potential is generally driven to a negative value with respect to the chamber walls within a few dozen RF cycles. Furthermore, when RF power levels change during the etch process, the wafer potential is driven to a changed value, typically nearly synchronous with the change in RF power. To avoid upsetting the voltage balance between both poles and the wafer, an automatic bias compensation, managed by the ESC power supply, has normally been utilized. In this compensation method the center point of the two pole voltages is driven to the same electrical potential as the wafer surface by equalizing both ESC pole currents. This, however, may lead to arcing on the wafer, since the ESC power supply is too slow to follow fast voltage changes on the wafer surface as they occur, for instance, during plasma ignition.

FIG. 1A shows a silicon wafer 12 that is damaged by an arcing event that may occur during an etching process. In this example, a surface potential (for example, −1000V) is generated at the top surface of the wafer which is being bombarded by electrons during an etching process. On the other hand, a substrate potential (e.g., 0V) exists in the substrate of the silicon wafer 12. Therefore, due to the potential difference between the top of the dielectric wafer surface and the wafer substrate, arcing 14 can occur between metal structures embedded in the dielectric of the wafer 12 since they establish differential voltage dividers of the surface-to-substrate potential drop. When the voltage differential between adjacent metal structures within the dielectric of the wafer exceeds the electrical breakdown strength of that dielectric, arcing will occur, leading to damage or destruction of the structures within the dielectric layer. In most cases, this will render the wafer unusable even though only as little as one die on the wafer may have been affected by the arcing. Consequently, if such occurrences are allowed to happen, wafer yields would be decreased and wafer production costs would increase.

FIG. 1B shows a graph 40 that shows a real-time surface potential during plasma ignition 42 in accordance with one embodiment of the present invention. The graph 40 shows a steady state surface potential 48, and an initial substrate potential 44 as it would be driven by the bias compensation circuit of the ESC power supply as it occurs during an etching process. The graph 40 shows the surface potential 42 as time progresses. The slope of the surface potential 42 at an early time is extremely steep so the surface potential 42 quickly increases to the steady state surface potential 48. Therefore, a very large voltage difference 46 may occur extremely quickly between the surface potential 42 and the initial substrate potential 44. Unfortunately, in this circumstance, the surface potential 42 increases too quickly for the compensation circuit of the ESC power supply. Therefore the substrate potential cannot be adjusted in a timely response to the surface potential increase. Therefore, wafer arcing as is described in reference to FIG. 1A may occur thereby damaging the wafer and decreasing wafer production yield and efficiency.

Therefore, there is a need for method that overcomes the problems of the prior art by using different bias voltages that correspond to different wafer etching stages and processes so in any suitable etching process, the bias voltage utilized can reduce wafer arcing.

SUMMARY OF THE INVENTION

Broadly speaking, the present invention fills these needs by providing a method for reducing wafer arcing in wafer etching operations. It should be appreciated that the present invention can be implemented in numerous ways, including as a process, an apparatus, a system, a device or a method. Several inventive embodiments of the present invention are described below.

In one embodiment, a method for reducing wafer damage during an etching process is provided. In one of the many embodiments, the method includes assigning a bias voltage to each of at least one etching process, and generating the assigned bias voltage before initiation of one of the at least one etching process. The method further includes applying the assigned bias voltage to an electrostatic chuck before initiation of one of the at least one etching processes. The assigned bias voltage level reduces wafer arcing.

In yet another embodiment, a method for reducing wafer damage during an etching process is provided. The method includes generating a recipe bias table that includes associations between at least one bias voltage and at least one etching process where each one of the at least one etching process corresponding to the at least one bias voltage. The method also includes determining an etching process to be conducted, and matching the etching process to a corresponding bias voltage by using the associations in a recipe table. The method further includes generating one of the at least one bias voltage corresponding to the etching process. The method also includes applying the one of the at least one bias voltage to an electrostatic chuck (ESC) before initiation of the etching process. The one of the at least one bias voltage reduces arcing in a wafer during the etching process.

In yet another embodiment, a method for determining bias voltage for reducing wafer damage during an etching process is provided. In this embodiment, the method includes determining an etching process to be conducted. The method further includes matching the etching process to a corresponding bias voltage by using associations in a recipe table which includes associations between at least one bias voltage and at least one etching process where each one of the at least one etching process corresponding to the at least one bias voltage.

In another embodiment, a computer readable media is provided that has program instructions for determining bias voltage for reducing wafer damage where a bias voltage setting circuit determines the bias voltage that a voltage bias generator applies to an electrostatic chuck (ESC) during etching to reduce wafer arcing. The computer readable media includes program instructions for determining an etching process to be conducted. The computer readable media also includes program instructions for matching the etching process to a corresponding bias voltage by using associations in a recipe table which includes associations between at least one bias voltage and at least one etching process, each one of the at least one etching process corresponding to the at least one bias voltage.

The advantages of the present invention are numerous. Most notably, by creating a method of associating bias voltages applied to the electrostatic chuck (ESC) with different wafer etching processes, the bias voltages may be intelligently set to a particular bias voltage before each particular etching stage. In this way, each etching process that could generate a different voltage potential between a surface of the wafer and substrate can be compensated for thereby reducing wafer arcing. Therefore, by adjusting and tailoring the bias voltage applied to the ESC to each specific etching process step, wafer arcing can be reduced in an effective manner. Therefore, advantageously, this method enables the use of multiple etching chemistries and etch chamber conditions so that different etching operations may be used without the problems of arcing. This may result in a more controlled etching process. Additionally, because wafer damage can be decreased dramatically, the wafer yield loss can be decreased.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention is disclosed for a method to intelligently decreasing wafer arcing during etch procedures and other procedures such as, for example, deposition procedures or whenever there is a process where plasma interacts with a wafer and a bias compensation is needed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

In general terms, the present invention is directed toward a method whereby an etch process may be utilized with a dramatic reduction in arcing between structures of the wafer, between a structure and the substrate, or between a structure and the plasma. This may be accomplished by presetting bias voltages for each separate etching process. Because each separate etching process may create the possibility of different bias voltage potentials, by associating bias voltages applied to the electrostatic chuck (ESC) with different corresponding wafer etching processes, the bias voltages may be intelligently set to a particular bias voltage before each particular etching stage. In this way, the magnitude of the voltage difference between the surface of the wafer and the substrate can be reduced which may decrease or eliminate the occurrence of wafer arcing. By using such a method, wafer processing operations may be made less damaging to wafers and thereby generate higher yield in wafer production because the occurrence of arcing that could damage structures in the wafer is reduced or eradicated.

Figure 1A:
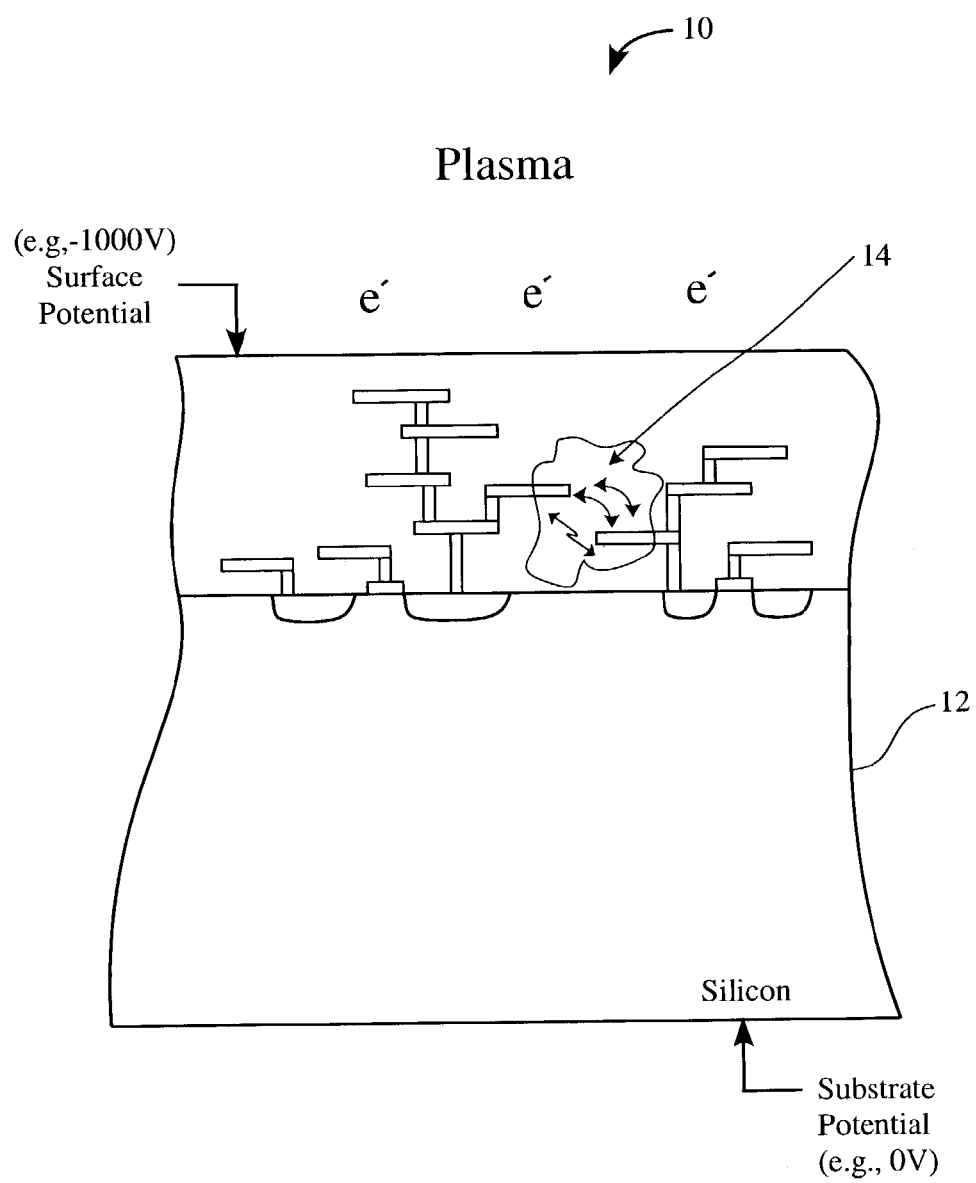
FIG. 1A shows a silicon wafer that is damaged by an arcing event that may occur during an etching process.
Figure 1B:
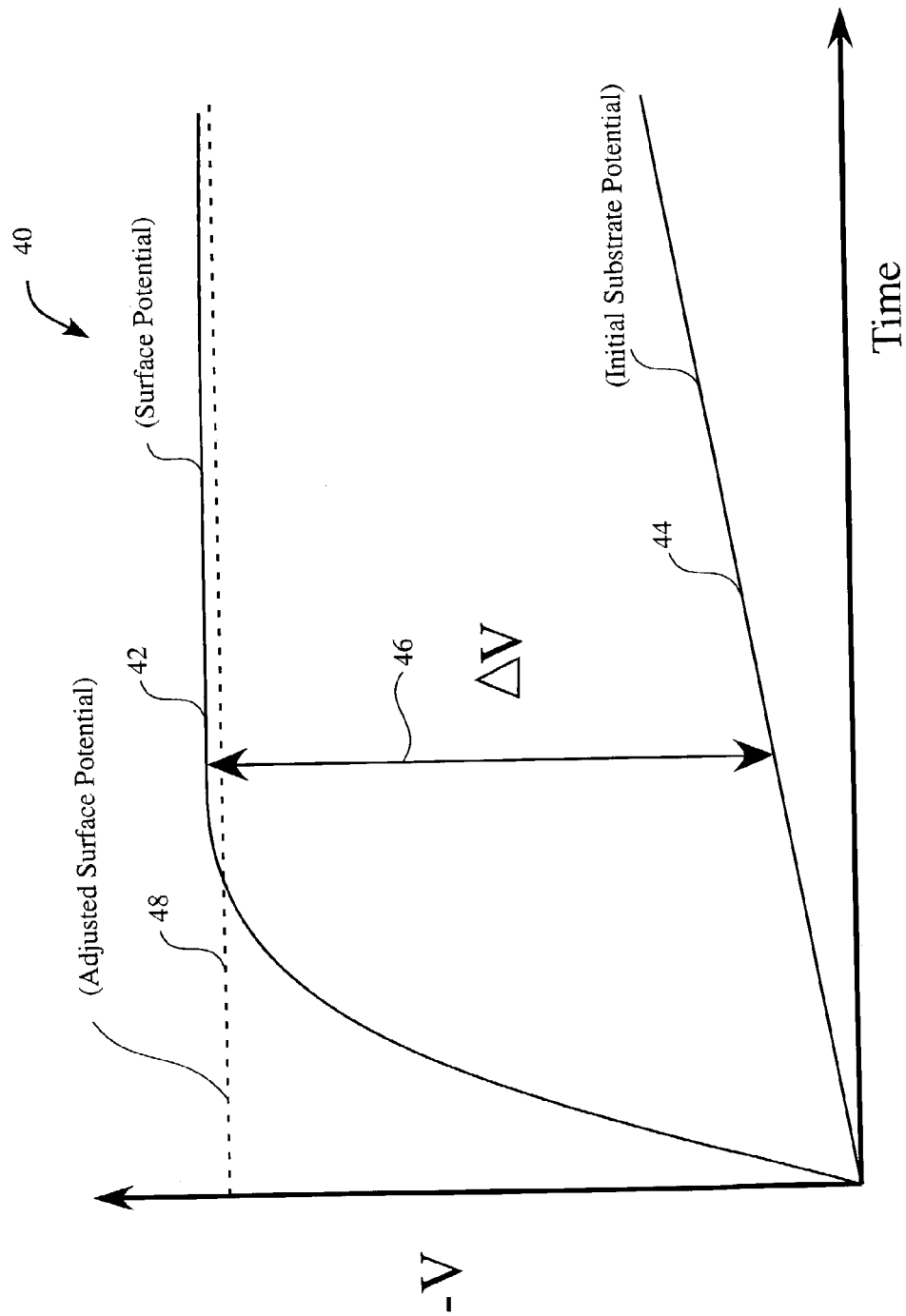
FIG. 1B shows a graph that shows a real-time surface potential during plasma ignition in accordance with one embodiment of the present invention.
Figure 2:
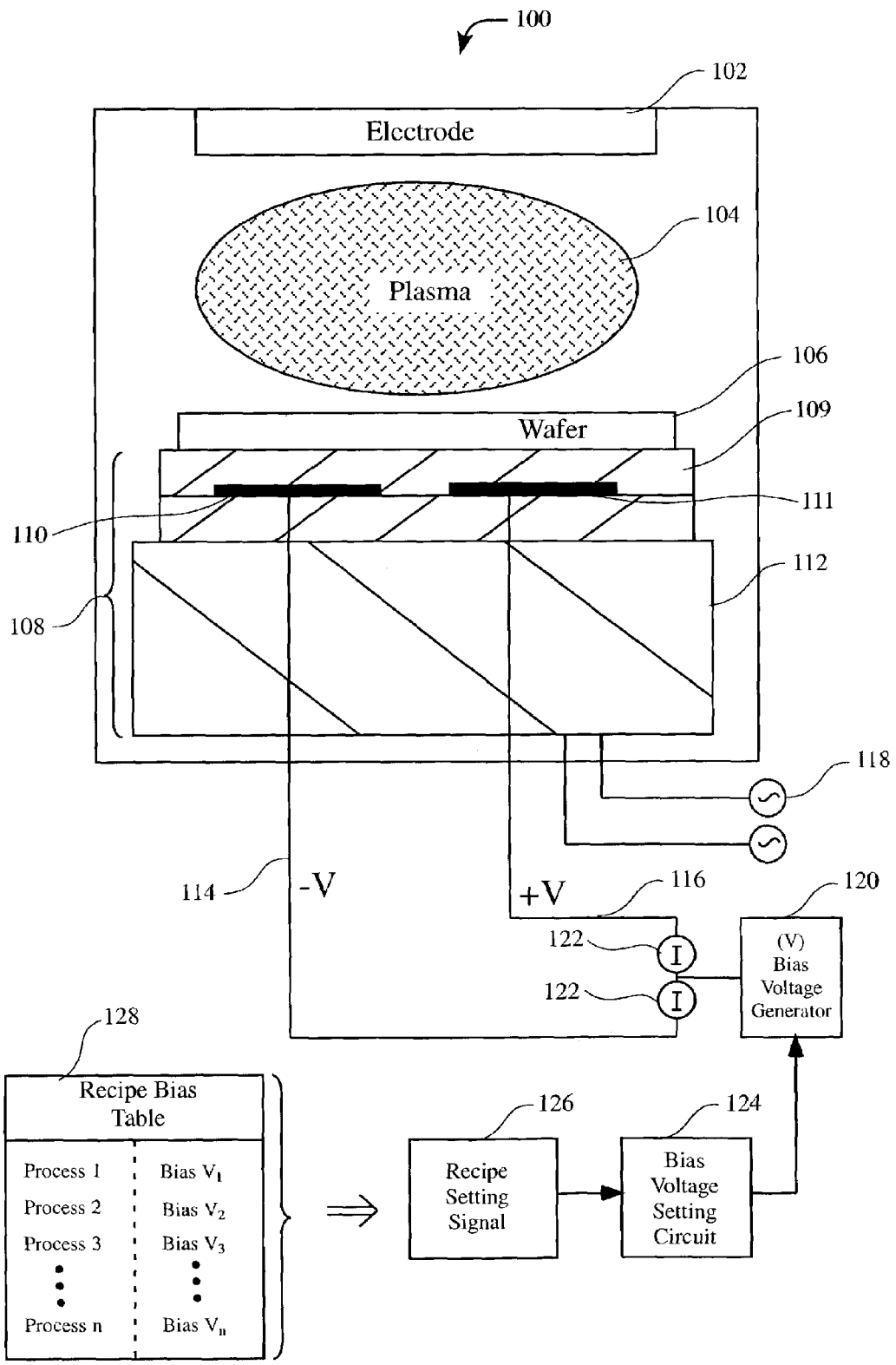
FIG. 2 shows an etching chamber with voltage bias control using a recipe bias table in accordance with one embodiment of the present invention.

FIG. 2 shows an etching chamber 100 with voltage bias control using a recipe bias table 128 in accordance with one embodiment of the present invention. In this embodiment, the etching chamber 100 includes a powered electrode 112 and a grounded electrode 102 to produce plasma within the chamber 100. The chamber 100 also includes a radio frequency (RF) generator 118. The RF power generates plasma 104 for etching operations in a mechanism known to those skilled in the art. As is well known in the art, different "recipes" may be utilized depending on the etching operation. It should be appreciated that the apparatus and methodology described herein may be used with any suitable recipes and any suitable number of recipes to reduce arcing that may damage a wafer 106.

The etching chamber 100 also includes an electrostatic chuck (ESC) 108 which in one embodiment may include the a layer 109, electrodes 110, 111, and the RF powered electrode 112 that may hold the wafer 106 in place during an etching operation. Within the ESC 108 are electrodes 110 and 111. The electrodes 110 and 111 are connected to a bias voltage generator 120 through voltage lines 114 and 116 respectively. The ESC 108 is disposed over a base 112. In one embodiment, the layer 109 of the ESC 108 is made out of a leaky dielectric material so the electrodes 110 and 111 are electrically sermi-isolated thereby generating leaky capacitors when clamp and bias voltages are applied to lines 114 and 116. It should be appreciated that the semi-insulating material may be any suitable material that may semiinsulate the electrodes from one another to sustain a voltage drop between them and to the substrate. In one embodiment, the semi-insulating material may be any suitable type of DC semi-insulating ceramic. The powered RF electrode may be any suitable material such as, for example, aluminum, stainless steel etc.

In one embodiment, the level of the bias voltage (also known as bias voltage level) is determined by a recipe bias table 128. The recipe bias table 128 includes associations between at least one voltage level and at least one etching process. Therefore, a particular etching process corresponds with a particular bias voltage level. In addition, the particular bias voltage level may also correspond to multiple etching processes. In effect, each of the etching processes included in the recipe bias table 128 includes a corresponding bias voltage level that controls the voltages applied to the ESC 108 through the lines 114 and 116 to reduce wafer arcing during each of the etching processes.

Each of the etching processes has a particular "recipe" utilized. It should be appreciated that methodology described herein may be used with any suitable type of recipe. The recipe is a set of conditions under which the etching takes place. For example, a particular etching recipe could include usage of specific pressures, chemistries, power level, etc. Therefore, depending on the etching process and therefore depending on the recipe, different voltage differentials may exist between a wafer surface and a wafer substrate. Consequently, particular bias voltages may be utilized for particular etching operations thereby tailoring the bias voltage to the particular etching operation to reduce wafer arcing. Different bias voltages may be assigned to different recipes used for etching processes. It should be appreciated that the recipe bias table 128 may be either embodied in software or hardware. Therefore, a particular bias voltage level for a corresponding etching process may be calculated to optimize a wafer etching process.

After determination of the bias voltage level for a particular etching process, a recipe setting signal is sent to a bias voltage setting circuit. The bias voltage setting circuit 124 manages the bias voltage generator 120 to generate the bias voltage. In one embodiment, the bias voltage setting circuit 124 may include a digital to analog converter to convert a digital recipe setting signal to an analog voltage.

Figure 3:
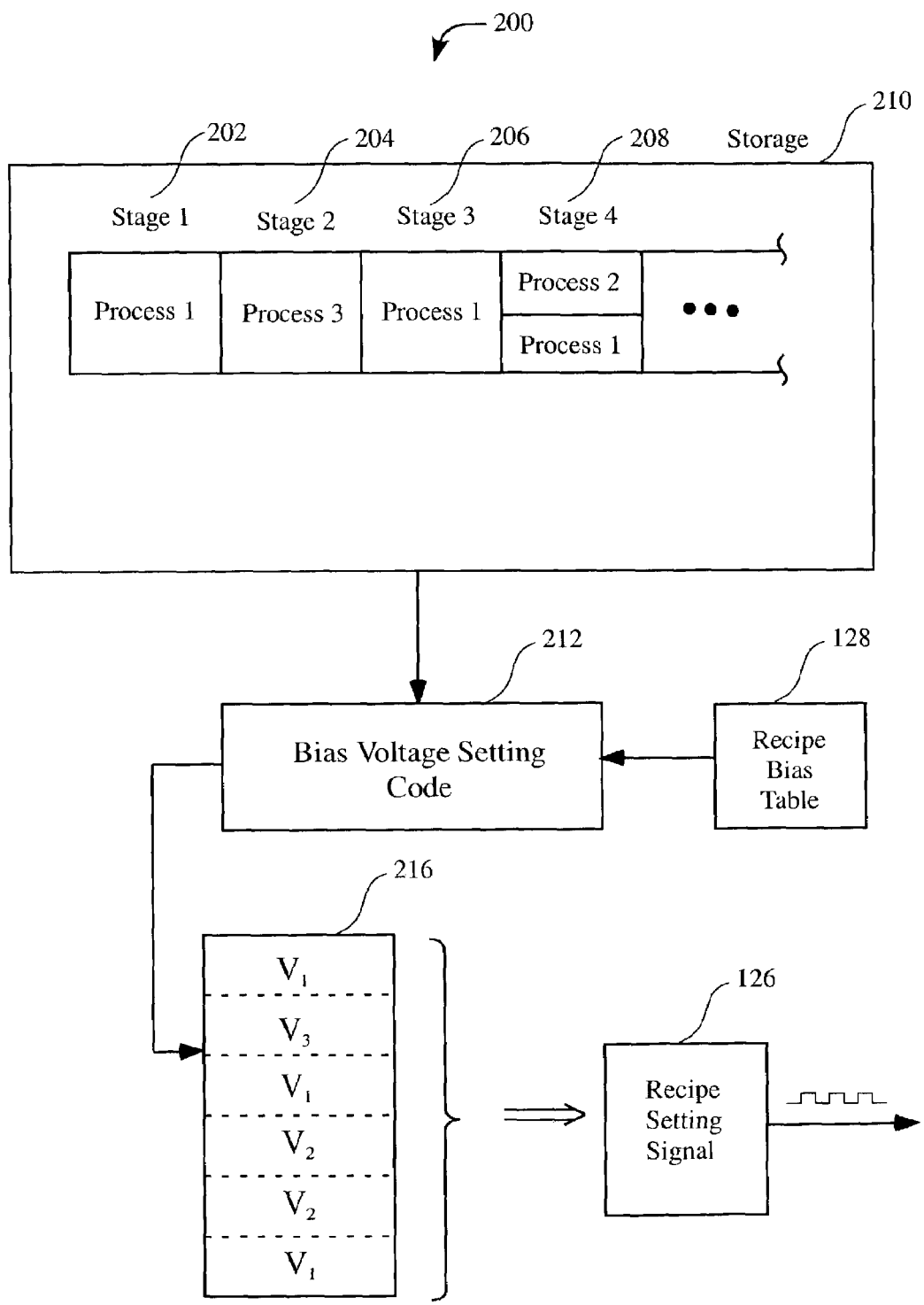
FIG. 3 illustrates a method of generating a recipe setting signal in accordance with one embodiment of the present invention.

FIG. 3 illustrates a method of generating a recipe setting signal in accordance with one embodiment of the present invention. In one embodiment, a bias voltage setting code 212 receives the recipe bias table 128 and the processes that are to be utilized in a particular etching operation. In one embodiment, the particular etching operation includes stage-1 202, stage-2 204, stage-3 206 and stage-4 208. In one embodiment, the stage-1 utilizes a process-1, the stage-2 utilizes a process-3, the stage-3 utilizes the process-1, and the stage-4 utilizes the process-2 and the process-1. It should be appreciated that the methodology described herein to set a voltage bias to reduce or eliminate wafer arcing may be utilized with any suitable type of numbers of etching operations. In addition, it should be understood that the methodology described herein to reduce the wafer arcing may be utilized with any suitable etching operations that may have any suitable numbers or type of processes.

The bias voltage setting code 212 examines each of the stages 202, 204, 206, and 208 to determine what processes are used with each of the stages. Then by using the recipe bias table 128, the bias voltage setting code 212 may match each of the processes with a corresponding bias voltage level. Therefore, for all of the processes, the corresponding bias voltage levels are identified and a set of voltages 216 is generated such that for each of the processes that are done, the correct bias voltage levels are utilized. Therefore, the set of voltages 216 is incorporated into the recipe setting signal 126 to be sent to the bias voltage setting circuit as discussed in reference to FIG. 2.

Figure 4:
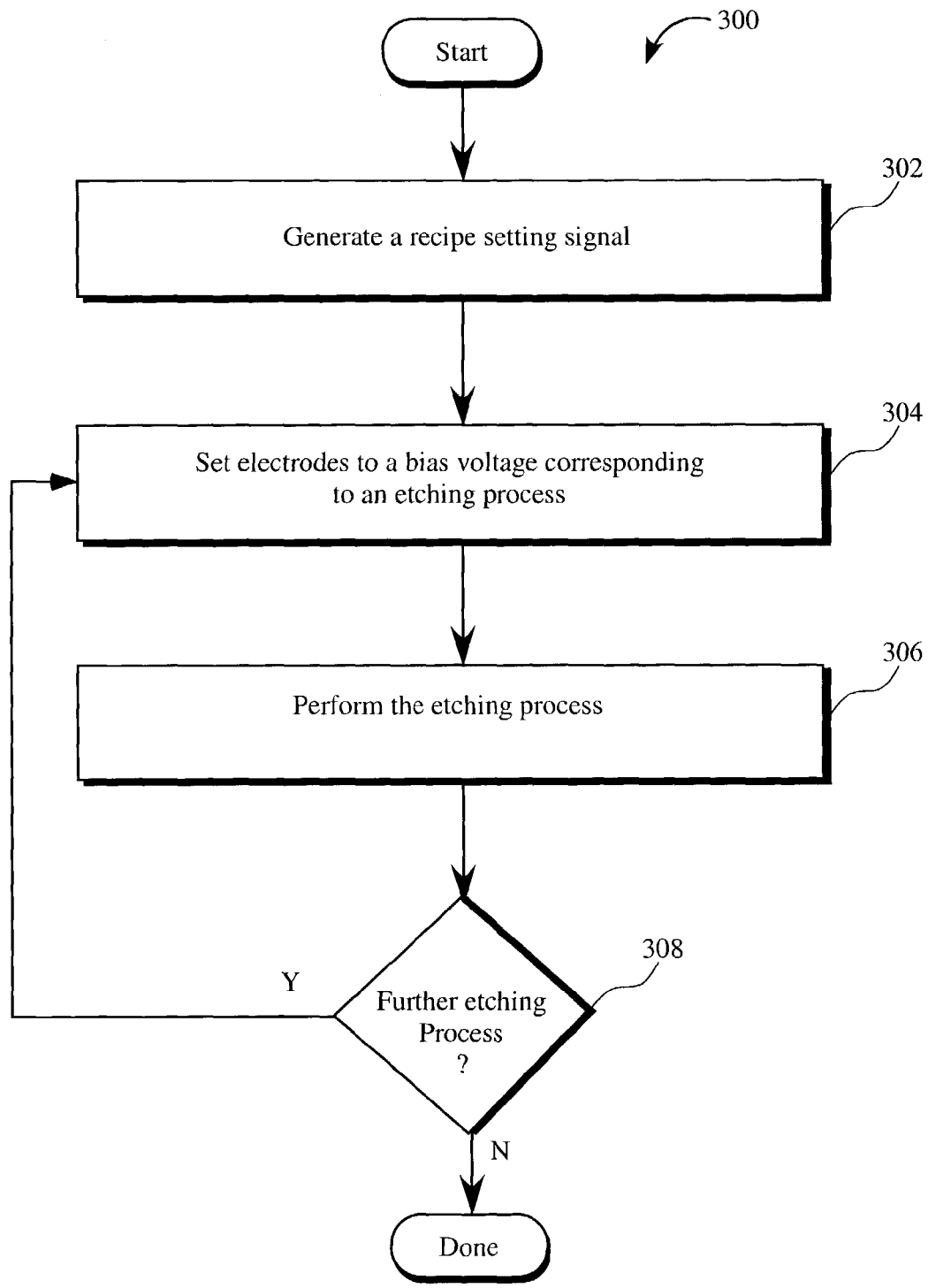
FIG. 4 shows a flowchart showing a method for generating a recipe setting signal in accordance with one embodiment of the invention.

FIG. 4 shows a flowchart 300 showing a method for generating a recipe setting signal in accordance with one embodiment of the invention. Flowchart 300 begins with operation 302 which generates a recipe setting signal which in one embodiment is the recipe setting signal 126 as described in reference to FIG. 3. In one embodiment, the operation 302 is the bias voltage setting code 312 as described above in reference to FIG. 3. The recipe setting signal includes a set of voltages that correspond to processes which make up stage(s) of a wafer etching operation. By having a specific bias voltage for each of the processes, the optimal voltage level may be utilized for each process which may be prone to arcing since this method reduces the voltage differentials between the wafer surface potential and the wafer substrate potential. In one embodiment, the recipe bias table includes at least one process used with certain stage(s) of a particular etching process which is each associated with a bias voltage. In this way, a particular process corresponds to a particular bias voltage that can reduce or eliminate wafer arcing when the bias voltage is applied to the ESC.

After operation 302, the method advances to operation 304 which sets electrodes to a bias voltage corresponding to an etching process. In one embodiment, the electrodes 110 and 111 as those described in reference to FIG. 2 may be set to a voltage level corresponding to the etching process to be done in an etching chamber. The voltage level that is utilized is predetermined as indicated by the recipe setting signal so the wafer may be attached to the ESC and arcing is reduced or eliminated. Consequently, different voltage bias levels that adjust the substrate potential to be closer to the wafer surface potential may be utilized for each process used in a wafer etching operation.

Then operation 306 performs the etching process. In one embodiment, once the bias voltage is set for the etching process, the etching process may proceed without problems of wafer arcing. This may occur because the bias voltage reduces the voltage potential differences between the wafer surface and the wafer substrate. It should be appreciated that any suitable type of etching or deposition process may be performed such as, for example, etching of low-k dielectrics, inorganic dielectrics, etc.

After operation 306, the method moves to operation 308 which determines if a further etching process is to be conducted. If an additional etching process is to be conducted, the method repeats operations 304, 306, and 308. If there are no further etching processes, the method ends.

Figure 5:
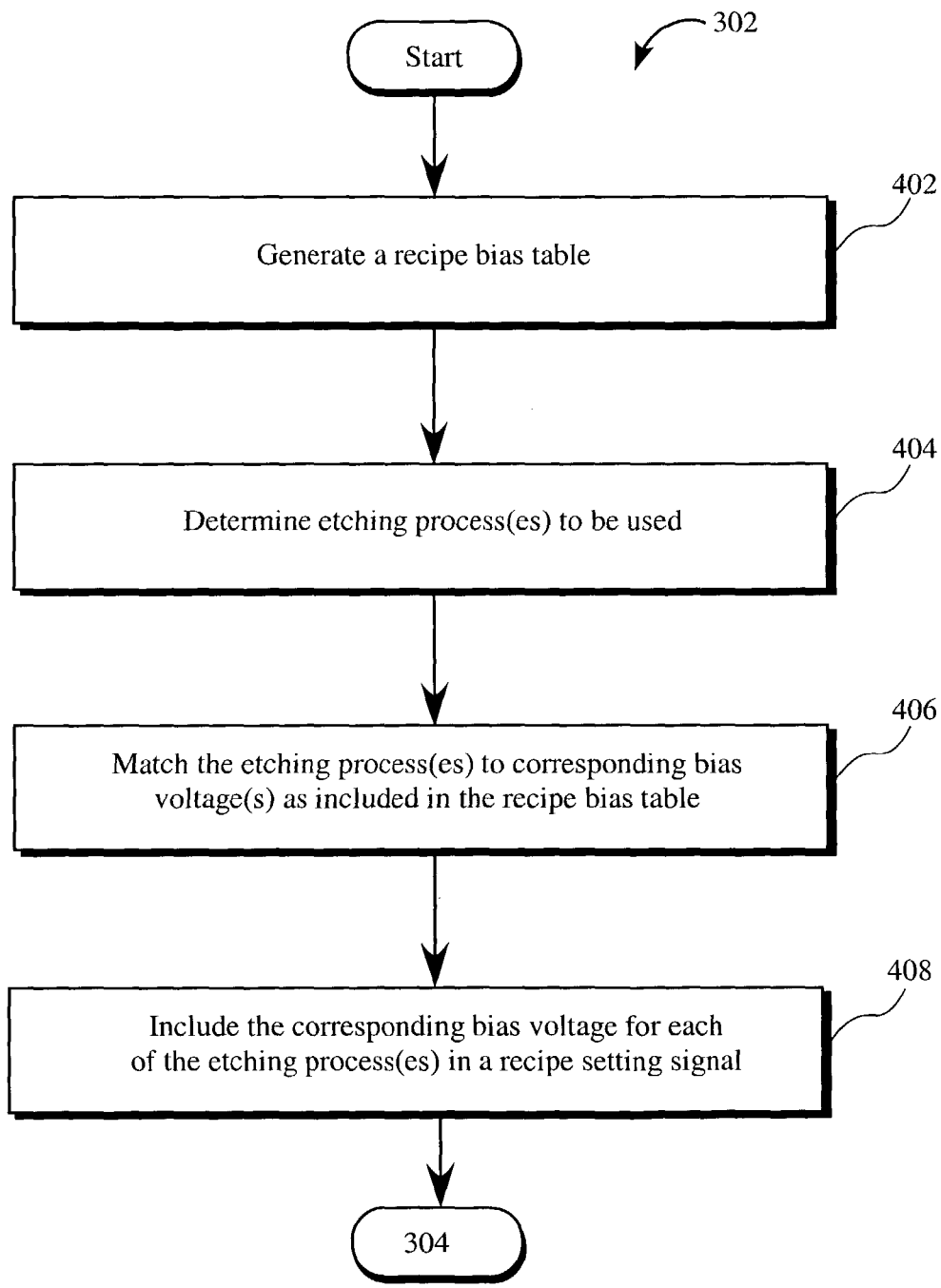
FIG. 5 shows a flowchart which defines the generating of a recipe setting signal in accordance with one embodiment of the present invention.

FIG. 5 shows a flowchart 302 which defines the generating of a recipe setting signal in accordance with one embodiment of the present invention. The flowchart 302 begins with operation 402 which generates a recipe bias table. In one embodiment, operation 402 includes creating associations between each of the etching processes with a particular bias voltage where the particular bias voltages have been pre-tested to be found wafer arc reducing bias compensation voltages. By associating the processes with the corresponding bias compensation voltages and storing the data, the associations may be used to determine optimum bias compensation voltages for any suitable etching process or any group of etching processes.

After operation 402, the method advances to operation 404 which determines which of the etching process(es) to be used. It should be understood that the etching processes that are to be done could be stored or inputted in any suitable way. In one embodiment, the processes are placed in storage to be retrieved by the bias voltage setting code 212 as discussed above in reference to FIG. 3. The bias voltage code can obtain the processes from any suitable type of storage device.

Then operation 406 matches the etching process(es) to corresponding bias voltage(s) as included in the recipe bias table. In one embodiment, the etching stage is one stage used in an etching operation. It should be appreciated in any etching operation, there may be one or more etching stages each with at least one process. Each of the processes uses a particular recipe which may generate different wafer surface and wafer substrate potentials. Therefore, by utilizing a certain bias voltage level for a particular process, wafer arcing may be avoided.

After operation 406, the method proceeds to operation 408 which includes the corresponding bias voltage for each of the etching process(es) in a recipe setting signal. In one embodiment, when the voltage bias levels have been determined for each etching process in each of the etching stages, this data is incorporated in the recipe setting signal to be set to the bias voltage setting circuitry that may utilize the data to manage the bias voltage generator 120 as discussed above in reference to FIG. 3.

FIGS. 6 through 9 show exemplary circuitry that may be utilized to set and generate bias voltages. It should be appreciated that the circuitry shown below is merely exemplary in nature and that any suitable type of hardware or software may be generated as long as the inventive methodologies as described herein are utilized.

Figure 6:
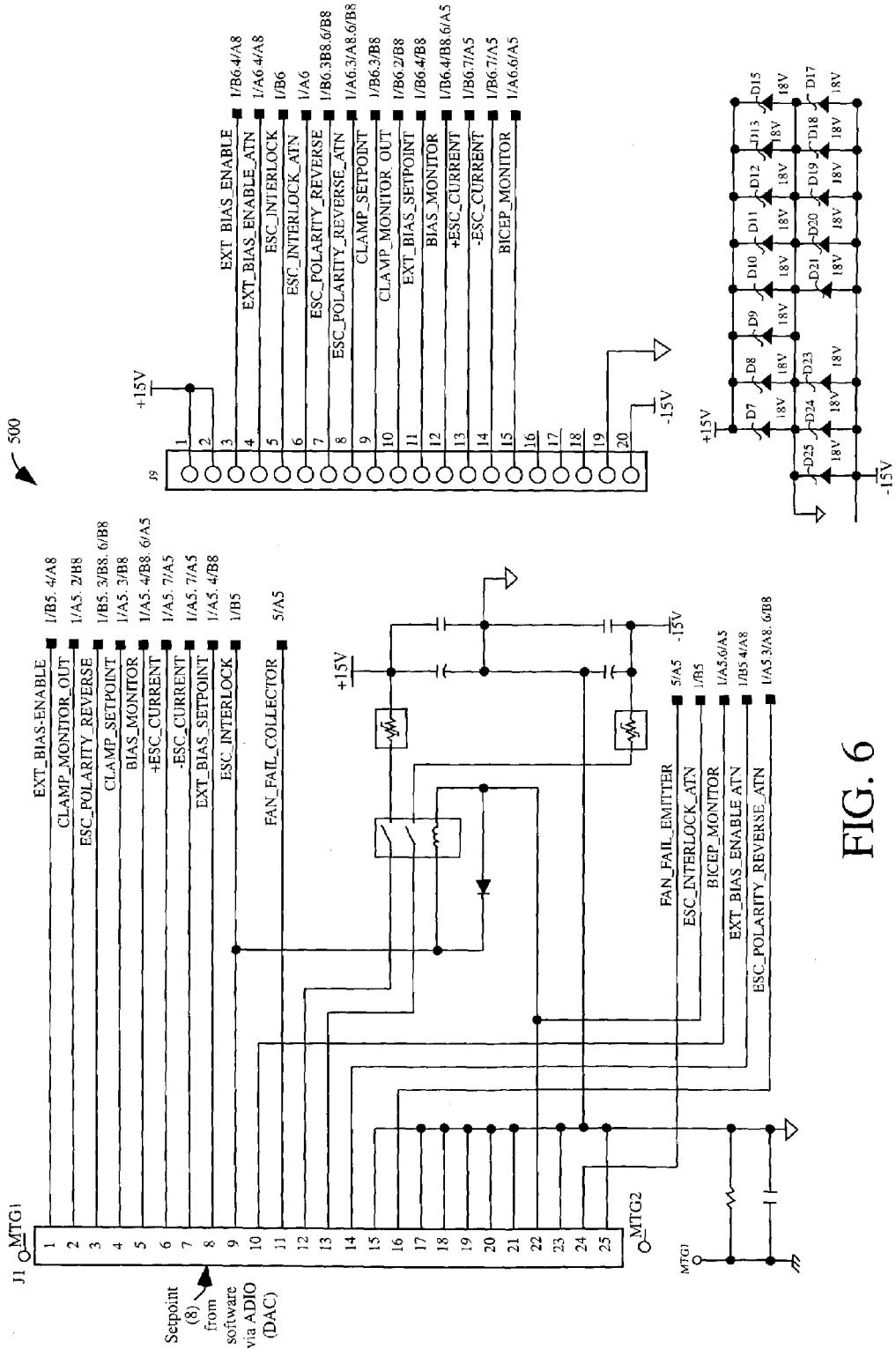
FIG. 6 illustrates circuitry that for setting bias voltage in accordance with one embodiment of the present invention.

FIG. 6 illustrates circuitry 500 that for setting bias voltage in accordance with one embodiment of the present invention. In one embodiment, the circuitry 500 includes pins 1 and 14 which enable an external bias control (from software). The pin 8 may be a bias voltage set point input for a bias voltage value. This value may come from software via a digital/analog converter (DAC).

Figure 7:
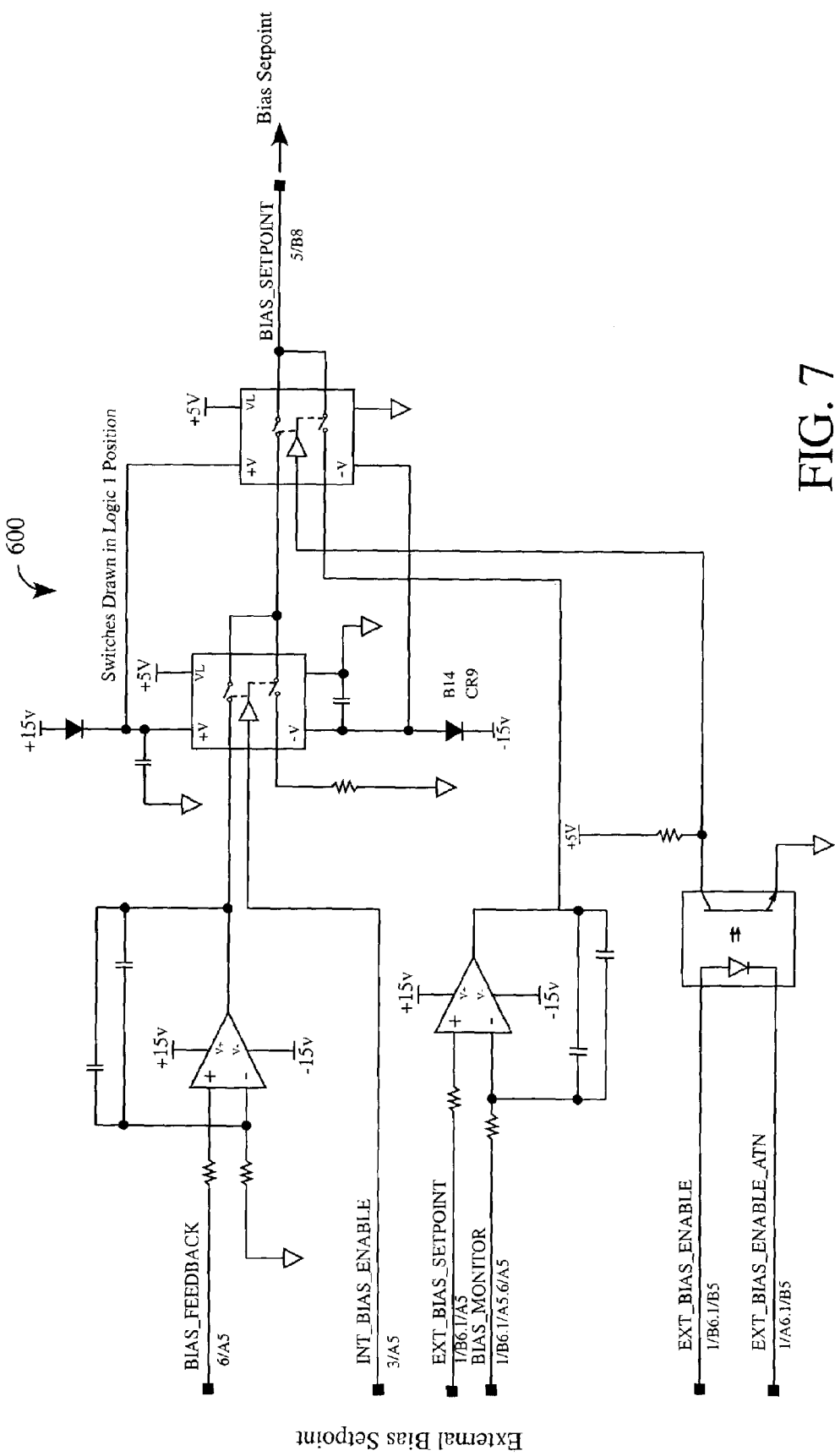
FIG. 7 shows additional circuitry for setting bias voltage in accordance with one embodiment of the present invention.

FIG. 7 shows additional circuitry 600 for setting bias voltage in accordance with one embodiment of the present invention. In one embodiment, the circuitry 600 is configured to receive external bias voltage setpoints from the circuitry 500 as described in reference to FIG. 6 to generate bias voltage setpoints. In one embodiment, the external bias voltage setpoints are derived from software such as, for example, a bias voltage setting code such as, in one embodiment, the one described above in reference to FIG. 3.

Figure 8:
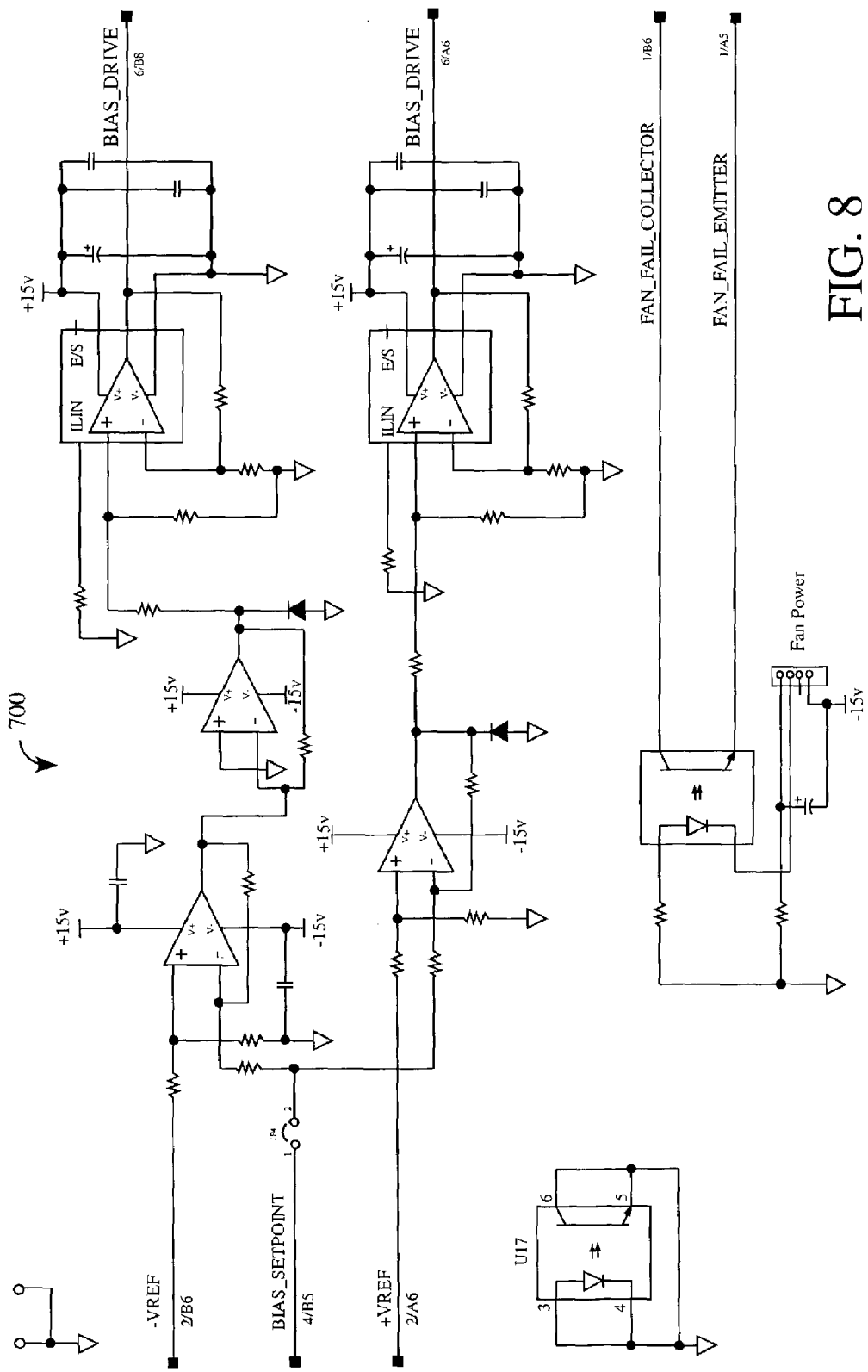
FIG. 8 shows circuitry for generating bias voltage in accordance with one embodiment of the present invention.

FIG. 8 shows circuitry 700 for generating bias voltage in accordance with one embodiment of the present invention. In one embodiment, the circuitry 700 is configured to receive an input of the bias setpoint from the circuitry 600 as described in reference to FIG. 7 and generate dual bias drive values.

Figure 9:
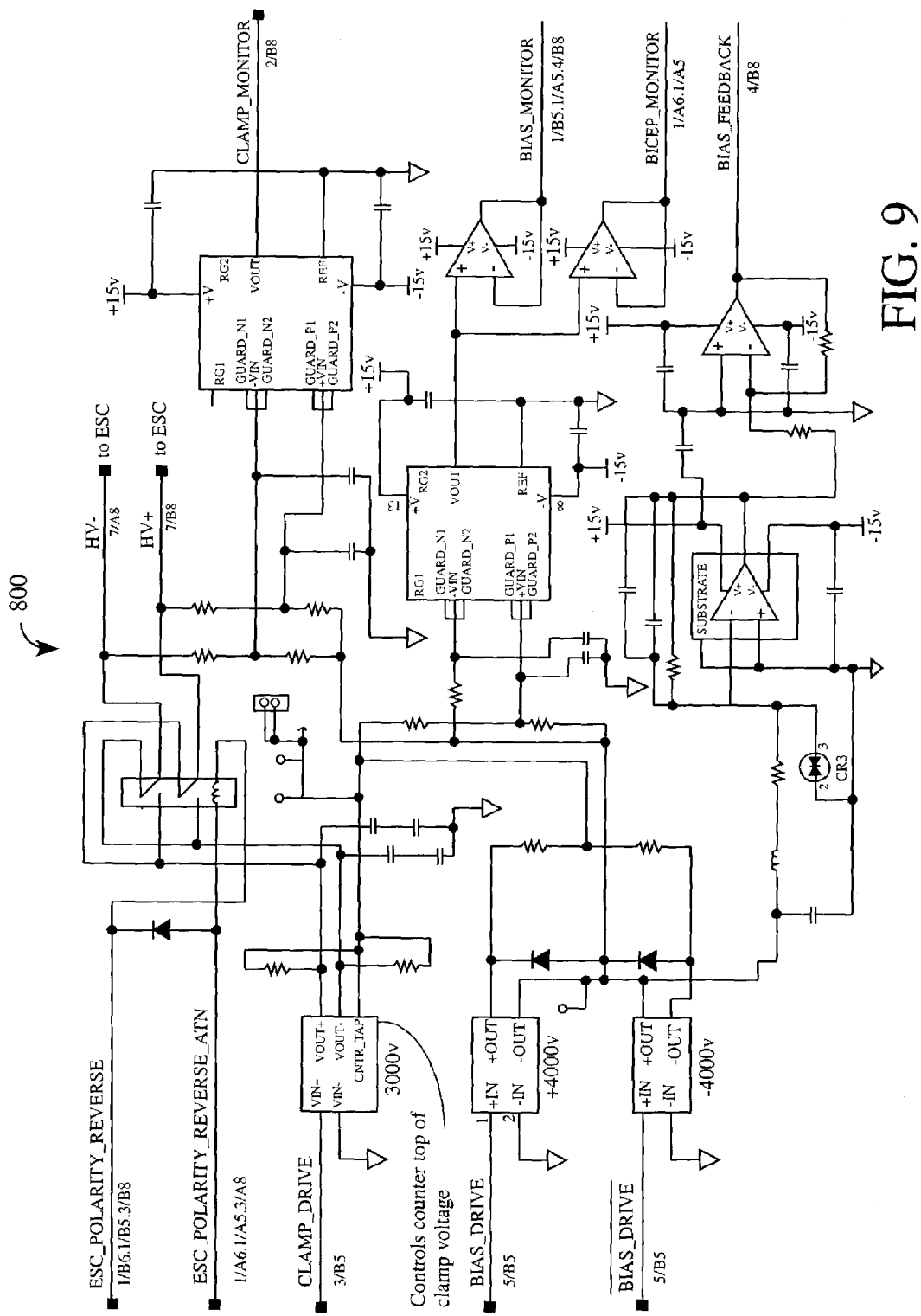
FIG. 9 illustrates further circuitry for generating bias voltage in accordance with one embodiment of the present invention.

FIG. 9 illustrates further circuitry 800 for generating bias voltage in accordance with one embodiment of the present invention. In one embodiment, the circuitry 800 is configured to use the dual bias drive inputs received from the circuitry 700 as described in reference to FIG. 8 and generate bias voltages for, in one embodiment, the lines 110 and 111 as described in reference to FIG. 2.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for reducing wafer damage during an etching process, comprising:
    assigning a first bias voltage from a plurality of bias voltages, wherein each one of the plurality of bias voltages correspond to at least one of a plurality of etching processes;
    generating the assigned bias voltage before initiation of a selected one of the plurality of etching processes;
    applying the assigned bias voltage to an electrostatic chuck before initiation of the selected one of the plurality of etching processes; and
    performing the selected one of the plurality of etching processes;
    wherein the assigned bias voltage generates a voltage differential between adjacent metal structures within a dielectric of the wafer, wherein the voltage differential is less than an electrical breakdown strength of the dielectric layer when the selected one of the plurality of etching processes is being performed.

2. A method for reducing wafer damage during an etching process as recited in claim 1, wherein the etching process includes etching a low-k dielectric.

3. A method for reducing wafer damage during an etching process as recited in claim 1, wherein the assigning includes determining the bias voltage that reduced wafer arcing for the selected at least one etching process.

4. A method for reducing wafer damage during an etching process as recited in claim 1, wherein generating the assigned bias voltage includes:
    determining the selected etching process to be utilized,
    matching the the selected etching process to a corresponding assigned bias voltage;
    generating a recipe setting signal including the assigned bias voltage.

5. A method for reducing wafer damage during an etching process as recited in claim 1, wherein applying the assigned bias voltage includes applying the assigned bias voltage to electrodes in the electrostatic chuck.

6. A method for reducing wafer damage during an etching process as recited in claim 1, wherein the bias voltage reduces a voltage potential between a wafer surface and a wafer substrate.

7. A method for reducing wafer damage during an etching process as recited in claim 1, wherein the bias voltage assigned to the selected etching process is stored in a recipe bias table.

8. A method for reducing wafer damage during an etching process, comprising:
    generating a recipe bias table that includes associations between each one of a plurality of bias voltages and each one of a plurality of etching processes;
    determining a first etching process from the plurality of etching processes to be conducted;
    matching the first etching process to a corresponding first bias voltage by using the associations in a recipe table;
    generating the first bias voltage;
    applying the first bias voltage to an electrostatic chuck before initiation of the first etching process; and
    performing the first etching process;
    wherein the one of the first bias voltage generates a voltage differential between adjacent metal structures within a dielectric of the wafer, wherein the voltage differential is less than an electrical breakdown strength of the dielectric layer when the first etching processes is being performed.

9. A method for reducing wafer damage during an etching process as recited in claim 8, wherein the first etching process includes etching a low-k dielectric.

10. A method for reducing wafer damage during an etching process as recited in claim 8, wherein the recipe table is stored in software.

11. A method for reducing wafer damage during an etching process as recited in claim 8, wherein applying the assigned bias voltage includes applying the assigned bias voltage to electrodes in the electrostatic chuck.

12. A method for reducing wafer damage during an etching process as recited in claim 8, wherein the bias voltage reduces a voltage potential between a wafer surface and a wafer substrate.

13. A method for reducing wafer damage during an etching process as recited in claim 8, further comprising:
completing the first etching process;
ceasing applying the first bias voltage to the electrostatic chuck;
determining a second etching process from the plurality of etching processes to be conducted;
matching the second etching process to a corresponding second bias voltage by using the associations in a recipe table;
generating the second bias voltage;
applying the second bias voltage to the electrostatic chuck before initiation of the second etching process; and
performing the second etching process;
wherein the one of the second bias voltage generates a voltage differential between adjacent metal structures within a dielectric of the wafer, wherein the voltage differential is less than an electrical breakdown strength of the dielectric layer when the second etching processes is being performed.

14. A method for reducing wafer damage during an etching process as recited in claim 8, wherein the bias voltage is applied to the electrostatic chuck through electrodes disposed inside the electrostatic chuck.

15. A method for reducing wafer damage during an etching process as recited in claim 8, wherein electrostatic chuck contains a ceramic material.

16. A method for determining bias voltage for reducing wafer damage during an etching process, comprising:
determining a first etching process to be conducted; and
matching the first etching process to a corresponding first bias voltage by using associations in a recipe table which includes associations between each one of a plurality of bias voltages and a corresponding each one of a plurality of etching processes process, wherein the one of the first bias voltage generates a voltage differential between adjacent metal structures within a dielectric of the wafer, wherein the voltage differential is less than an electrical breakdown strength of the dielectric layer when the first etching processes is being performed.

17. A method for determining bias voltage for reducing wafer damage as recited in claim 16, wherein the first etching process includes etching a low-k dielectric.

18. A method for determining bias voltage for reducing wafer damage as recited in claim 16, wherein the recipe table is stored in software.

19. A method for determining bias voltage for reducing wafer damage as recited in claim 16, wherein the bias voltage reduces a voltage potential between a wafer surface and a wafer substrate.

20. A computer readable media having program instructions for determining bias voltage for reducing wafer damage where a bias voltage setting circuit determines the bias voltage that a voltage bias generator applies to an electrostatic chuck during etching to reduce wafer arcing, the computer readable media comprising:
program instructions for determining a first etching process to be conducted; and
program instructions for matching the first etching process to a corresponding first bias voltage by using associations in a recipe table which includes associations between each one of a plurality of bias voltages and a corresponding each one of a plurality of etching processes, wherein the one of the first bias voltage generates a voltage differential between adjacent metal structures within a dielectric of the wafer, wherein the voltage differential is less than an electrical breakdown strength of the dielectric layer when the first etching processes is being performed.

21. A computer readable media having program instructions as recited in claim 20, wherein the first etching process includes etching a low-k dielectric.

22. A computer readable media having program instructions as recited in claim 20, wherein the bias voltage reduces a voltage potential between a wafer surface and a wafer substrate.

* * * * *